United States Patent [19]
Sun

[11] Patent Number: 5,999,553
[45] Date of Patent: Dec. 7, 1999

[54] MONOLITHIC RED/IR SIDE BY SIDE LASER FABRICATED FROM A STACKED DUAL LASER STRUCTURE BY ION IMPLANTATION CHANNEL

[75] Inventor: Decai Sun, Sunnyvale, Calif.

[73] Assignee: Xerox Corporation, Stamford, Conn.

[21] Appl. No.: 08/977,301

[22] Filed: Nov. 25, 1997

[51] Int. Cl.⁶ .................................................. H01S 3/19
[52] U.S. Cl. ............................. 372/50; 372/46; 372/23
[58] Field of Search ............................. 372/23, 46, 50, 372/97; 257/14, 17

[56] References Cited

U.S. PATENT DOCUMENTS

| | | | |
|---|---|---|---|
| 4,577,207 | 3/1986 | Copeland | 372/50 |
| 5,212,706 | 5/1993 | Jain | 372/50 |
| 5,319,655 | 6/1994 | Thornton | 372/23 |
| 5,386,428 | 1/1995 | Thornton et al. | 372/50 |
| 5,465,263 | 11/1995 | Bour et al. | 372/23 |
| 5,708,674 | 1/1998 | Beernink et al. | 372/50 |

OTHER PUBLICATIONS

D.P. Bour et al., "Infra–red AlGaAs and visible AlGaInP laser–diode stack", *Electronics Letters*, vol. 29, No. 21, Oct. 14, 1993, pp. 1855–1856.

R. S. Geels et al., "Dual spot visible laser diodes", *Electronics Letters*, vol. 28, No. 15, Jul. 16, 1992, pp. 1460–1462.

J. S. Major et al., "Individually Addressable, High Power Singlemode Laser Diodes at 0.8, 0.85 and 0.92 μm", *Electronics Letters*, vol. 28, No. 4, Feb. 13, 1992, pp. 391–393.

*Primary Examiner*—Hemang Sanghavi
*Attorney, Agent, or Firm*—William Propp

[57] ABSTRACT

A monolithic laser structure has an infrared laser structure stacked on top of a red laser structure. An ion implantation channel from the substrate of the infrared laser structure to the lower cladding layer of the red laser structure lets both laser structures use a common electrode on the substrate of the red laser structure. A portion of the monolithic structure is etched down to the red laser structure for the electrode of the red laser structure. The monolithic laser structure has a red and infrared side by side array from the two stacked red and infrared laser structures. The red and infrared laser structures can each have native oxide confined ridge waveguides.

16 Claims, 4 Drawing Sheets

MONOLITHIC RED/IR SIDE BY SIDE LASER FABRICATED FROM A STACKED DUAL LASER STRUCTURE BY ION IMPLANTATION CHANNEL

BACKGROUND OF THE INVENTION

This invention relates to a monolithic red and infrared wavelength laser structure and, more particularly, to a red/ir side by side laser array fabricated from a stacked dual laser structure by ion implantation channel.

Addressable monolithic multi-wavelength light sources, especially laser arrays that can simultaneously emit different wavelength light from different elements in the array are useful in a variety of applications, such as color printing, full color digital film recording, color displays, and other optical recording system applications.

The performance of many devices, such as laser printers and optical memories, can be improved by the incorporation of multiple laser beams. For example, laser printers which use multiple beams can have higher printing speeds and/or better spot acuity than printers which use only a single beam.

In many applications, closely spaced laser beams of different wavelengths are desirable. For example, color printers which use closely spaced laser beams of different wavelengths can overlap the beams, sweep those overlapping beams using a single raster output polygon scanner and a single set of optics, subsequently separate the individual beams using color selective filters, direct each beam onto a separate xerographic imaging station, develop a latent image for each color on a different recording medium, and produce a full color image by sequentially developing each latent image on a single recording medium.

One way to obtain closely spaced laser beams is to form multiple laser emission sites, or laser stripes, on a common substrate. While this enables very closely spaced beams, prior art monolithic laser arrays typically output laser beams at only one wavelength.

Various techniques are known in the prior art for producing different wavelength laser beams from a monolithic laser array. For example, it is well known that a small amount of wavelength difference can be obtained by varying the drive conditions at each lasing region. However, the easily achievable but small wavelength difference is insufficient for most applications.

One method of achieving larger wavelength separations is to grow a first set of active layers on a substrate to form a first lasing element which outputs light at one wavelength, and then to grow a second set of active layers next to the first to form a second lasing element at a second wavelength. However, this method requires separate crystal growths for each lasing element, something which is not easily performed.

Another technique for obtaining different wavelength laser beams from a monolithic laser array is to use stacked active regions. A stacked active region monolithic array is one in which a plurality of active regions are sandwiched between common cladding layers. Each active region is comprised of a thin volume that is contained within a laser stripe. The laser stripes contain different numbers of active regions that emit laser beams at different wavelengths.

In a stacked active region monolithic laser array, current flows in series through the stacked active regions. The active region with the lowest bandgap energy will lase, thereby determining the wavelength of the laser beam output from that part of the array. To provide another wavelength output, the previously lowest bandgap energy active region is removed from part of the array and current is sent through the remaining stacked regions.

Stacked active region monolithic laser arrays can not only output closely spaced laser beams of different wavelengths, but beneficially the output laser beams are axially aligned with each other (i.e. they share the same optical axes). In practice, the stacked regions of a stacked active region monolithic laser array are very closely spaced. Separations in the stack direction typically are about 100 nm.

A major problem with stacked active region monolithic laser arrays is that they have been difficult to fabricate, particularly in the AlGaAs semiconductor material system. This problem occurs at least partially because the proper stacked active regions must be formed in each part of the structure.

However, it is very difficult to precisely etch the areas between the active regions when those active regions are closely spaced. Further, because of undesired growths on many materials when those materials are exposed to air, such as oxide growths on some compositions of AlGaAs, it is very difficult to achieve the required high quality growths over the remaining active regions.

It is an object of this invention to provide stacked active region lasers in a monolithic structure capable of outputting closely spaced, multiple wavelength laser beams.

SUMMARY OF THE INVENTION

The present invention provides a monolithic laser structure having an infrared laser structure stacked on top of a red laser structure. An ion implantation channel from the substrate of the infrared laser structure to the lower cladding layer of the red laser structure lets both laser structures use a common electrode on the substrate of the red laser structure. A portion of the monolithic structure is etched down to the red laser structure for the electrode of the red laser structure. The monolithic laser structure has a red and infrared side by side array from the two stacked red and infrared laser structures. The red and infrared laser structures can each have native oxide confined ridge waveguides.

Other objects and attainments together with a fuller understanding of the invention will become apparent and appreciated by referring to the following description and claims taken in conjunction with the accompanying drawings.

DETAILED DESCRIPTION OF THE PREFERRED EMBODIMENTS

Figure 1:
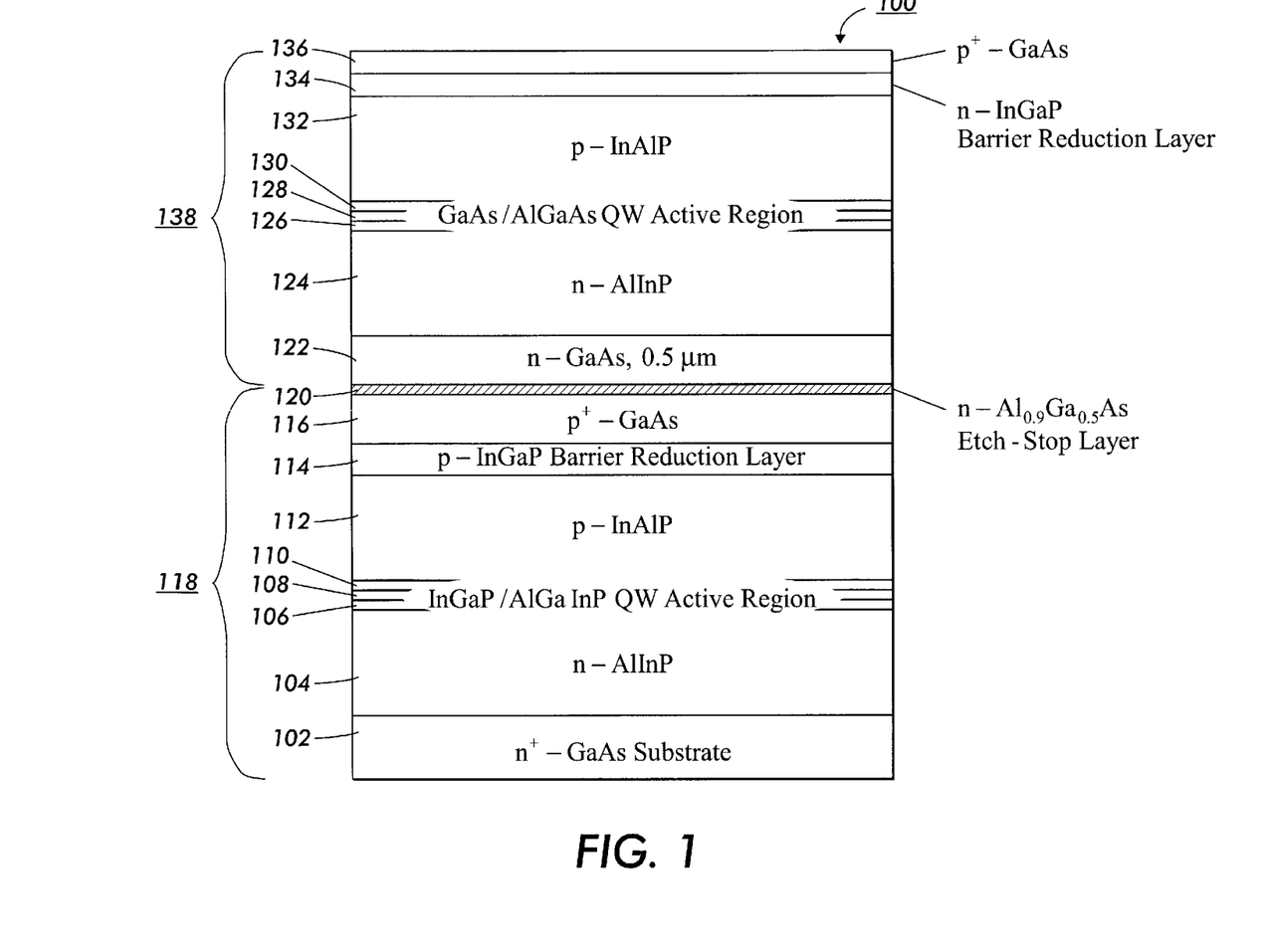
FIG. 1 is a cross-sectional side view of the semiconductor layers of the Red/IR stack laser structure of the present invention.

Reference is now made to FIG. 1 which illustrates a Red/Infrared stack monolithic laser structure 100 in accordance to the present invention.

As shown in FIG. 1, an n-type $Al_{0.5}In_{0.5}P$ lower cladding layer 104 is grown on an n-type GaAs substrate 102 using a well-known epitaxial deposition process commonly referred to as metal-organic chemical vapor deposition (MOCVD). Other deposition processes such as liquid phase epitaxy (LPE), molecular beam epitaxy (MBE), or other known crystal growth processes can also be used. The aluminum mole fraction and doping level of the lower cladding layer 104 range from 50 percent and 1 to $5\times10^{18}$ cm$^{-3}$ respectively. The thickness of the AlInP cladding layer 104 is approximately one micron ($\mu$m). The doping level of the n-type GaAs substrate 102 is approximately $5\times10^{18}$ cm$^{-3}$ or higher. Although not illustrated, a buffer layer may be deposited prior to the deposition of the lower cladding layer 104 in the event that lower throughputs are acceptable.

Above these layers is deposited an undoped $In_{0.5}(Al_{0.6}Ga_{0.4})_{0.5}P$ lower confinement layer 106, which has an aluminum content of about 30% and a thickness of about 120 nanometers. After this lower confinement layer 106 has been deposited, an $Ga_{0.4}In_{0.6}P$ active layer 108 is deposited, which will result in a light emission at 680 nanometers. The active layer 108 may be a single quantum well, a multiple quantum well, or a layer with thickness greater than that of a quantum well. The thickness of a quantum well typically ranges from five to twenty nanometers and in this example is 8 nanometers. Above the active layer 108 is deposited an undoped $In_{0.5}(Al_{0.6}Ga_{0.4})_{0.5}P$ upper confinement layer 110. The aluminum content of this confinement layer 110 is typically 30% and a thickness of about 120 nanometers. The lower and upper confinement layers, 106 and 110, together with the active layer 108, generally produce a laser structure with a lower threshold current and a smaller optical divergence.

After the upper confinement layer 110 has been formed, a p-type $Al_{0.5}In_{0.5}P$ upper cladding layer 112 of about one micron is deposited. Typically, this cladding layer 112 has an aluminum content of 50% and a magnesium doping level of $5\times10^{18}$ cm$^{-3}$. Upon the upper p-type $Al_{0.5}In_{0.5}P$ cladding layer 112 is deposited a barrier reduction $Ga_{0.5}In_{0.5}P$ layer 114, which typically has a thickness of 50 nanometers, and a magnesium doping level of approximately $5\times10^{18}$ cm$^{-3}$. Upon this barrier reduction GaInP layer 114 is deposited a p+-GaAs cap layer 116, which typically is 100 nanometers thick with a magnesium doping of $1\times10^{19}$ cm$^{-3}$.

These semiconductor layers 102 to 116 form the red laser structure 118.

Upon the p+-GaAs cap layer 116 of the red laser structure 118 is deposited a n-type $Al_{0.9}Ga_{0.1}As$ etch stop layer 120. The aluminum mole fraction and doping level of the etch stop layer 120 range from 90 percent and 1 to $5\times10^{18}$ cm$^{-3}$, respectively. The thickness of the AlGaAs etch stop layer 120 is approximately 20 nanometers.

Upon the etch stop layer 120 is deposited a n-type GaAs layer 122 conductive buffer layer. The thickness of the GaAs layer 122 is approximately one-half micron (0.5 $\mu$m). The doping level of the n-type GaAs conductive buffer layer 122 is approximately $5\times10^{18}$ cm$^{-3}$ or higher.

An n-type $Al_{0.5}In_{0.5}P$ lower cladding layer 124 is deposited on the GaAs conductive buffer layer 122. The aluminum mole fraction and doping level of the lower cladding layer 124 range from 50 percent and 1 to $5\times10^{18}$ cm$^{-3}$ respectively. The thickness of the AlInP cladding layer 124 is approximately one micron ($\mu$m).

Above these layers is deposited an undoped $Al_{0.4}Ga_{0.6}As$ lower confinement layer 126, which has an aluminum content of about 40% and a thickness of about 120 nanometers. After this lower confinement layer 126 has been deposited, an GaAs active layer 128 is deposited, which should result in a light emission at 830 nanometers. The active layer 128 may be a single quantum well, a multiple quantum well, or a layer with thickness greater than that of a quantum well. The thickness of a quantum well typically ranges from five to twenty nanometers and in this example is 7 nanometers. Above the active layer 128 is deposited an undoped $Al_{0.4}Ga_{0.6}As$ upper confinement layer 130. The aluminum content of this confinement layer 130 is typically 40% and a thickness of about 120 nanometers. The lower and upper confinement layers, 126 and 130, together with the active layer 128, generally produce a laser structure with a lower threshold current and a smaller optical divergence.

After the upper confinement layer 130 has been formed, a p-type $Al_{0.5}In_{0.5}P$ upper cladding layer 132 of about one micron is deposited. Typically, this cladding layer 132 has an aluminum content of 50% and a magnesium doping level of $5\times10^{18}$ cm$^{-3}$. Upon the upper p-type $Al_{0.5}In_{0.5}P$ cladding layer 132 is deposited a barrier reduction $Ga_{0.5}In_{0.5}P$ layer 134, which typically has a thickness of 50 nanometers, and a magnesium doping level of approximately $5\times10^{18}$ cm$^{-3}$. Upon this barrier reduction GaInP layer 134 is deposited a p+-GaAs cap layer 136, which typically is 100 nanometers thick with a magnesium doping of $1\times10^{19}$ cm$^{-3}$.

These semiconductor layers 122 to 136 form the infrared laser structure 138.

After all of the semiconductor layers of the Red/IR stack laser structure 100 shown in FIG. 1 have been deposited, a silicon nitride ($Si_3N_4$) patterned mask (not shown) is formed on the upper surface of the cap layer 136 by a photolithographic process.

Figure 2:
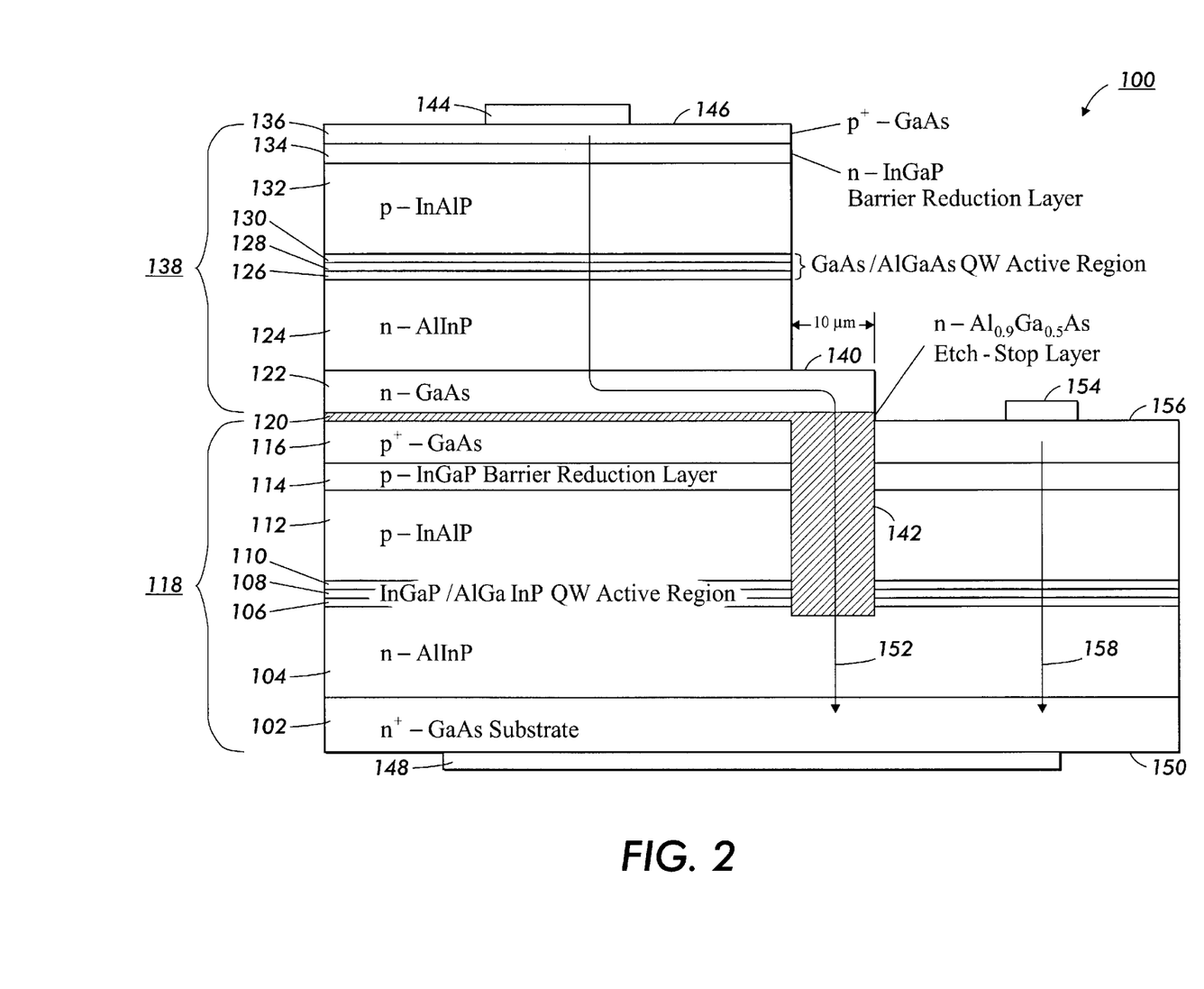
FIG. 2 is a cross-sectional side view of the semiconductor layers of the Red/IR side by side laser structure with an ion implantation channel of the present invention.

As shown in FIG. 2, the portion of the semiconductor structure 100 not covered by the silicon nitride is etched by wet chemical etching with citric acid ($C_6H_8O_7$:$H_2O$) :hydrogen dioxide ($H_2O_2$) and bromine acid (Hbr) down to the n-type GaAs layer 122 and the AlGaAs etch stop layer 120. The etching removes the unmasked portions of the cap layer 136, barrier reduction layer 134, upper cladding layer 132, upper confinement layer 130, active layer 128, lower confinement layer 126, and lower cladding layer 124. A 10 micron wide stripe 140 of the n-GaAs layer 122 immediately adjacent to the masked and unetched portion of the Red/IR stack laser structure 100 will not be etched. The remainder of the n-GaAs layer 122 not covered by the silicon nitride mask and not part of the stripe 140 will be etched down through the etch stop layer 120 to the p+-GaAs cap layer 116 of the red laser structure 118.

Reactive ion etching may be used in place of wet chemical etching.

The silicon nitride mask is then removed from the Red/IR stack laser structure 100.

Si-impurities with an average density of $5\times10^{19}$/cm$^3$ are then implanted in the exposed stripe 140 of the n-GaAs layer 122, as shown in FIG. 2. The dosage of the Si-implant is chosen to be slightly higher than the p-doping densities of the contact layer 116 and the cladding layer 112 of the red laser structure 118 below the stripe 140. After activation at a high temperature of approximately 900° C. for 5 minutes or longer, the p-type contact layer 116, the p-type barrier reduction layer 114, the p-type cladding layer 112, the undoped upper confinement layer 110, the undoped active layer 118 and the undoped lower confinement layer 106 below the stripe 140 in the red laser structure 118 are converted into a n-type ion implantation conductive channel 142 with an electron doping density of $2\times10^{19}$/cm$^3$. The conductive channel 142 extends through the bottom red laser structure 118 into the n-type lower cladding layer 104. The n-type GaAs conductive buffer 122 of the top infrared laser structure 138 is connected to the substrate 102 though this n-type conductive channel 142.

With this n-type conductive channel 142, the top infrared laser structure 138 can be biased through a Ti—Au p-contact 144 on the top surface 146 of the cap layer 136 and an Au:Ge n-contact 148 on the bottom surface 150 of the substrate 102. The current path 152 for the infrared laser structure 138 would be through the p-contact 144, through the cap layer 136, through the barrier reduction layer 134, through the upper cladding layer 132, through the upper confinement layer 130, through the active layer 128, through the lower confinement layer 126, through the lower cladding layer 124, laterally through the n-GaAs layer 122, through the conductive channel 142, through the lower n-cladding layer 104 of the red laser structure 118, through the n-substrate 102 of the red laser structure 118 and to the n-contact 148.

The Red/IR stack laser structure 100 is an edge emitting array. Conventional facets (not shown) are provided on the edge of the laser structure 100. The red laser structure 118 will emit light of red wavelength from the active region including the active layer 128 through the edge of the laser structure. The red laser structure 118 is independently addressable separate from the infrared laser structure 138.

Without the r-type conductive channel, a n-contact has to be put on the top of the n-GaAs layer 122 for the top laser structure. This lateral contact will cause higher series resistance for the top infrared laser structure 138 and will present difficulty in diode packaging.

The bottom red laser structure 118 can be biased through a Ti—Au p-contact 154 on the top surface 156 of the cap layer 116 and the Au:Ge n-contact 148 on the bottom surface 150 of the substrate 102. The current path 156 for the red laser structure 118 would be through the p-contact 154, through the cap layer 116, through the barrier reduction layer 114, through the upper cladding layer 112, through the upper confinement layer 110, through the active layer 108, through the lower confinement layer 106, through the lower cladding layer 104, through the n-substrate 102 and to the n-contact 148.

As noted, the Red/IR stack laser structure 100 is an edge emitting array and conventional facets (not shown) are provided on the edge of the laser structure 100. The infrared laser structure 138 will emit light of infrared wavelength from the active region including the active layer 108 through the edge of the laser structure. The infrared laser structure 138 is independently addressable separate from the red laser structure 118.

Alternately, prior to the deposition of the metal p- and n-contacts, oxide-confined buried ridge waveguides can be fabricated for the Red/IR stack laser structure 100 of FIG. 2.

After all the semiconductor layers of the semiconductor structure 100 shown in FIG. 1 have been deposited, and after the etching of portions of the cap layer 136, barrier reduction layer 134, upper cladding layer 132, upper confinement layer 130, active layer 128, lower confinement layer 126, lower cladding layer 124 and other portions of the n-type GaAs layer 122 down to the etch stop layer 120 and after ion implantation of the GaAs stripe down to the lower n-cladding layer 104, a first silicon nitride stripe (not shown) is formed on the upper surface of the cap layer 136 of the infrared laser structure 138 and a second silicon nitride stripe (also not shown) is formed on the upper surface of the cap layer 116 of the exposed (i.e. etched) red laser structure 118.

Figure 3:
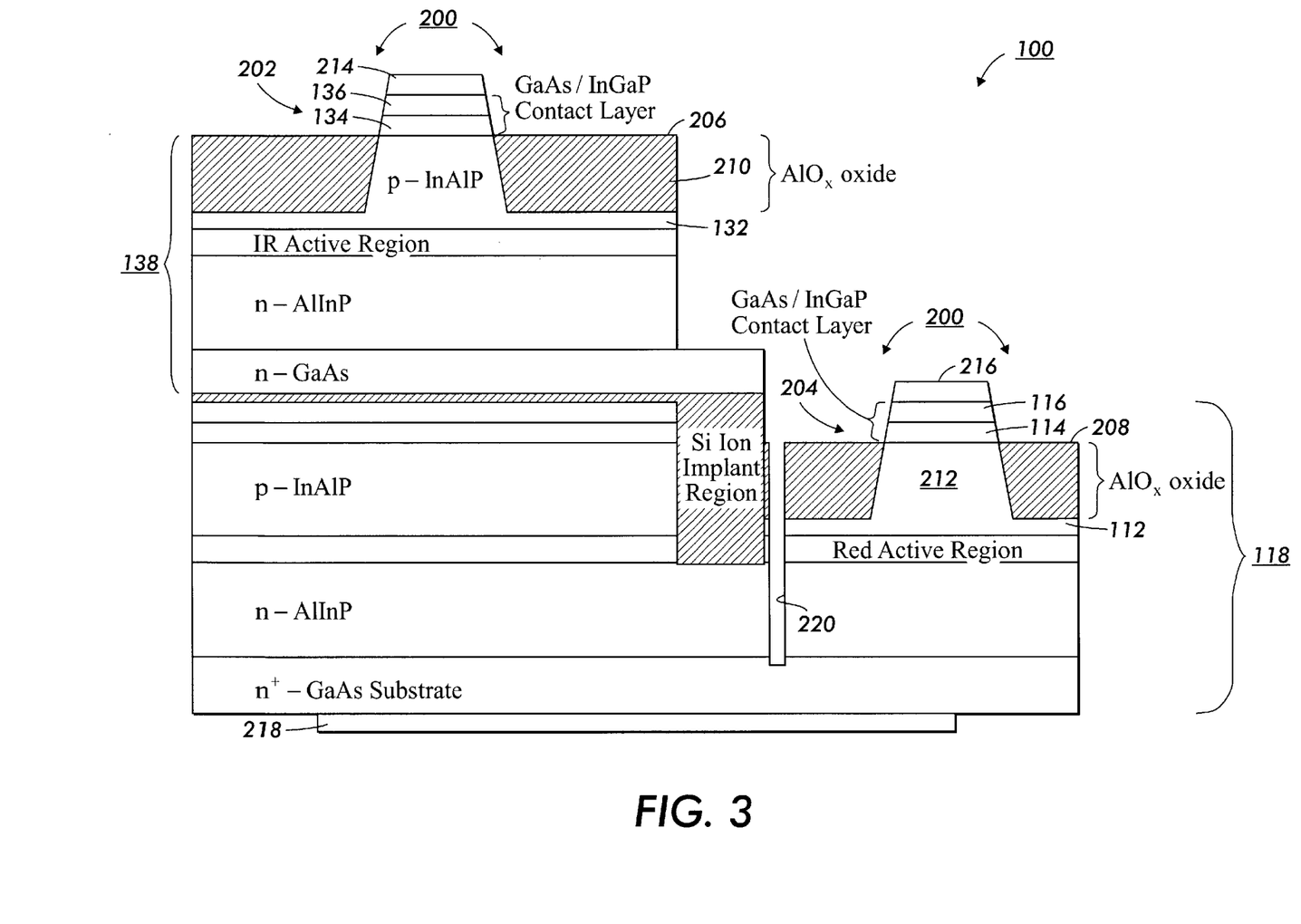
FIG. 3 is a cross-sectional side view of the semiconductor layers of the Red/IR side by side laser structure with a native oxide confined waveguide and an ion implantation channel of the present invention.

As shown in FIG. 3, the semiconductor structure 100 is etched in the areas on either side of the nitride stripes to form grooves 200.

A mixed bromine methanol (Br:CH$_3$OH) solution etches through the unmasked portions of the cap layer 136 and barrier reduction layer 134 into the AlInP upper cladding layer 132 leaving only a mesa 202 of the cap layer and the barrier reduction layer The mixed bromine methanol (Br:CH$_3$OH) solution also etches through the unmasked portions of the cap layer 116 and barrier reduction layer 114 into the AlInP upper cladding layer 112 leaving only a mesa 204 of the cap layer and the barrier reduction layer.

After the formation of the grooves with the silicon nitride stripes remaining on the surface of the cap layers of the mesa 202 of the infrared laser structure 138 and the mesa 204 of the red laser structure 118, the semiconductor structure 100 undergoes a wet oxidation step. The structure is typically oxidized with water vapor in a nitrogen environment at elevated temperatures, in excess of 530° C. for approximately 4 hours.

During the oxidation process, the remaining Al$_{0.5}$In$_{0.5}$P upper cladding layer 132 of the infrared laser structure 138 shown in FIG. 3 is exposed to the ambient through the grooves 200. Thus, the upper cladding layer 132, which comprises of AlInP with a high aluminum content, is oxidized radially outwards from each of the grooves into a native oxide (AlO$_x$) layer 206. The Al$_{0.5}$In$_{0.5}$P upper cladding layer 132 outside the silicon nitride stripe is oxidized down to the upper confinement layer 130.

Similarly, during the oxidation process, the remaining Al$_{0.5}$In$_{0.5}$P upper cladding layer 112 of the red laser structure 118 shown in FIG. 3 is exposed to the ambient through the grooves 200. Thus, the upper cladding layer 112, which comprises of AlInP with a high aluminum content, is oxidized radially outwards from each of the grooves into a native oxide (AlO$_x$) layer 208. The Al$_{0.5}$In$_{0.5}$P upper cladding layer 112 outside the silicon nitride stripe is oxidized down to the upper confinement layer 110.

An Al$_{0.5}$In$_{0.5}$P semiconductor material oxidizes slowly. Utilizing the selective oxidation of Al$_{0.5}$In$_{0.5}$P, ridge waveguide laser structures with deep native oxide layers can be fabricated without pinching off the p-Al$_{0.5}$In$_{0.5}$P cladding region.

Upon completion of oxidation as shown in FIG. 3, the silicon nitride stripes are removed. The native oxide layers 206 has been formed from the Al$_{0.5}$In$_{0.5}$P upper cladding layer 132 not covered by the silicon nitride strip and the native oxide layers 208 has been formed from the Al$_{0.5}$In$_{0.5}$P upper cladding layer 112 not covered by the silicon nitride strip.

The remaining unoxidized Al$_{0.5}$In$_{0.5}$P upper cladding layer 132 under the mesa 204 forms the ridge waveguide 210 for optical confinement of the light emitted from the active region of the infrared laser structure 138. The ridge waveguide 210 is confined by the native oxide layers 206.

The remaining unoxidized Al$_{0.5}$In$_{0.5}$P upper cladding layer 112 under the mesa 202 forms the ridge waveguide 212 for optical confinement of the light emitted from the active region of the red laser structure 118. The ridge waveguide 212 is confined by the native oxide layers 208.

The ridge waveguides 210 and 212 are index-guided. The index of refraction of the native oxide layers 206 and 208 is approximately 1.6, the index of refraction of the active region 106, 108 and 110 and the active region 126, 128 and 130 is about 3.2 and the index of refraction of the AlInP ridge waveguide 210 and 212 is approximately 3.0. The differences in indices of refraction provide a strong optical confinement of the light emitted by the active region by the ridge waveguide. The red laser structure 118 with its oxide confined ridge waveguide 212 and the red laser structure 138 with its oxide confined ridge waveguide 210 will each emit a single transverse mode light emission.

The native oxide regions 206 and 208 also improve the current confinement ability of the laser structure and severely limit current spreading between the two laser structures in the stack.

The boundaries between the active region, the ridge waveguide and the native oxide layers are relatively smooth and sharp as they are defined by an epitaxial growth process and a photolithography process. The spacing between the oxide regions 206 and 208 are controlled by using a photolithography mask and etch process. Since the photolithography process has a high degree of accuracy, the spacing between the oxide regions 206 and 208 can be minimal. Also, since these oxidized regions are defined after the epitaxial process has been completed, this approach allows for a high degree of process flexibility.

After the oxidation process and the removal of the silicon nitride stripes, a Ti—Au p-contact 214 can be deposited on the upper surface of the cap layer 136 for the infrared laser structure 138. A Ti—Au p-contact 216 can be deposited on the upper surface of the cap layer 116 for the red laser structure 118. An Au:Ge n-contact 218 can be deposited on the bottom surface of the substrate 102, common to both the infrared laser structure 138 and the red laser structure 118.

An isolation groove 220 is etched between the red laser structure 118 and the infrared laser structure 138 down to the substrate 102 to provide electrical and thermal isolation between the two laser structures in order to reduce crosstalk between the two laser structures.

The native oxide layers also provide good heat dissipation. The native oxide layers have excellent thermal conductance of 30 W/K m, which is five times better than the AlInP of the cladding layer and waveguide and twice higher than that of GaAs cap layer. Since the laser elements have low threshold and high efficiency, the thermal cross-talk among adjacent laser diodes is expected to be small.

Another benefit of using $Al_{0.5}In_{0.5}P$ alloy for the cladding layer is that AlInP has a much larger bandgap that AlGaAs. Infrared lasers with AlInP cladding layers will have a smaller leakage current at higher operating temperatures than all AlGaAs lasers.

The native oxide confined buried ridge waveguide Red/IR stack laser structure 100 of FIG. 3 uses phosphide semiconductor materials. Alternately, the native oxide confined buried ridge waveguide Red/IR stack laser structure 300 of FIG. 4 uses arsenide semiconductor materials but the same method of fabrication.

Figure 4:
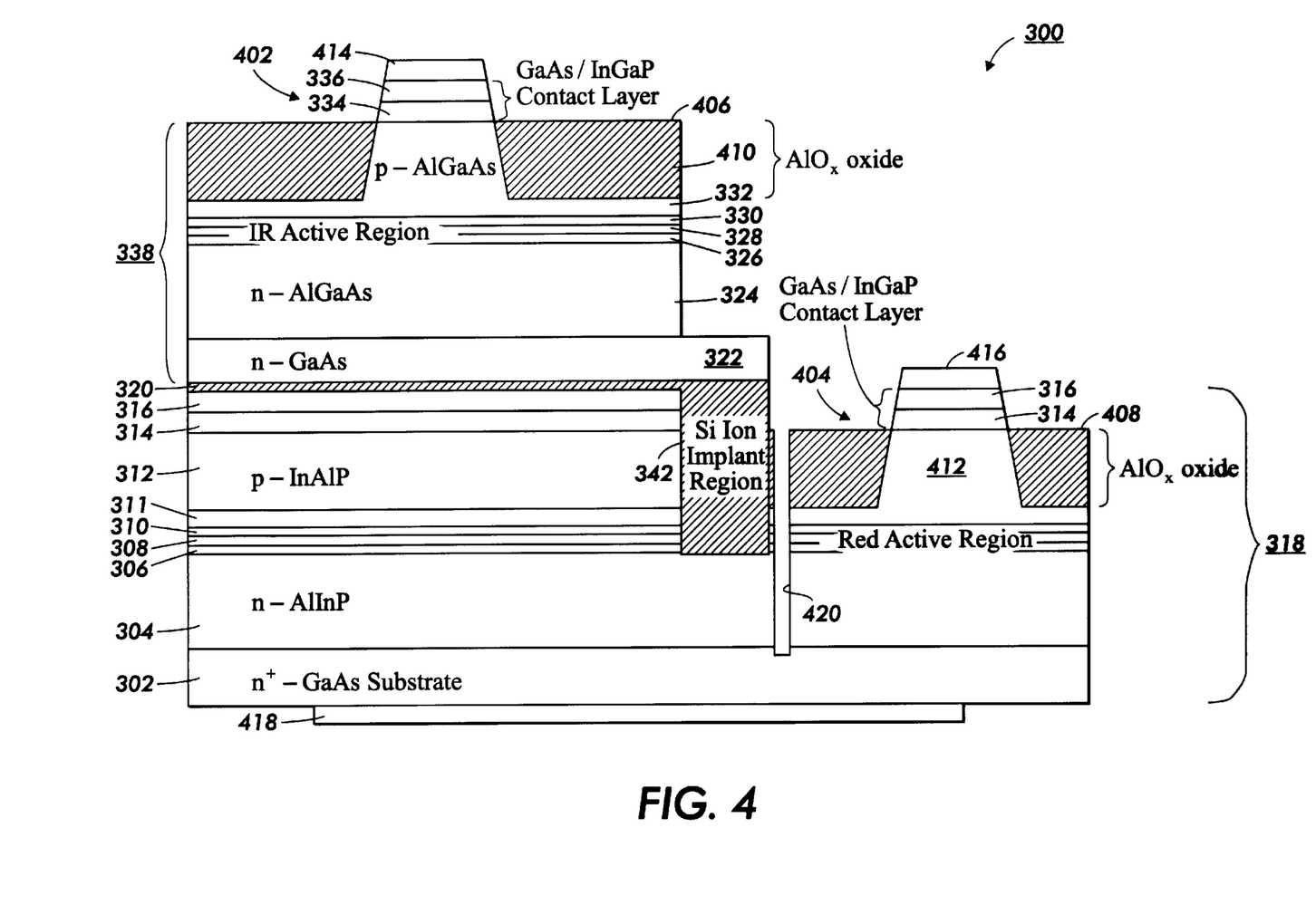

Thus, in the native oxide confined buried ridge waveguide Red/IR stack laser structure 300 of FIG. 4, an n-type $Al_{0.5}In_{0.5}P$ lower cladding layer 304 is grown on an n-type GaAs substrate 302 using a well-known epitaxial deposition process commonly referred to as metal-organic chemical vapor deposition (MOCVD). Other deposition processes such as liquid phase epitaxy (LPE), molecular beam epitaxy (MBE), or other known crystal growth processes can also be used. The aluminum mole fraction and doping level of the lower cladding layer 304 range from 50 percent and 1 to $5 \times 10^{18}$ cm$^{-3}$ respectively. The thickness of the AlInP cladding layer 304 is approximately one micron ($\mu$m). The doping level of the n-type GaAs substrate 302 is approximately $5 \times 10^{18}$ cm$^{-3}$ or higher. Although not illustrated, a buffer layer may be deposited prior to the deposition of the lower cladding layer 304 in the event that lower throughputs are acceptable.

Above these layers is deposited an undoped $In_{0.5}(Al_{0.6}Ga_{0.4})_{0.5}P$ lower confinement layer 306, which has an aluminum content of about 30% and a thickness of about 120 nanometers. After this lower confinement layer 306 has been deposited, an $Ga_{0.4}In_{0.6}P$ active layer 308 is deposited, which will result in a light emission at 680 nanometers. The active layer 308 may be a single quantum well, a multiple quantum well, or a layer with thickness greater than that of a quantum well. The thickness of a quantum well typically ranges from five to twenty nanometers and in this example is 8 nanometers. Above the active layer 308 is deposited an undoped $In_{0.5}(Al_{0.6}Ga_{0.4})_{0.5}P$ upper confinement layer 310. The aluminum content of this confinement layer 310 is typically 30% and a thickness of about 120 nanometers. The lower and upper confinement layers, 306 and 310, together with the active layer 308, generally produce a laser structure with a lower threshold current and a smaller optical divergence.

After the upper confinement layer 310 has been formed, a p-type $Al_{0.5}In_{0.5}P$ first upper cladding layer 311 of about 200 nanometers is deposited. Typically, this first upper cladding layer 311 has an aluminum content of 50% and a magnesium doping level of $5 \times 10^{18}$ cm$^{-3}$. Upon the first upper cladding layer 311 is deposited a p-type $Al_{0.8}Ga_{0.2}As$ second upper cladding layer 312 of about 800 nanometers is deposited. Typically, this second upper cladding layer 312 has an aluminum content of 50% and a magnesium doping level of $5 \times 10^{18}$ cm$^{-3}$.

Upon the second upper p-type AlGaAs cladding layer 312 is deposited a barrier reduction $Ga_{0.5}In_{0.5}P$ layer 314, which typically has a thickness of 50 nanometers, and a magnesium doping level of approximately $5 \times 10^{18}$ cm$^{-3}$. Upon this barrier reduction GaInP layer 314 is deposited a p+-GaAs cap layer 316, which typically is 100 nanometers thick with a magnesium doping of $1 \times 10^{19}$ cm$^{-3}$.

These semiconductor layers 302 to 316 form the red laser structure 318.

Upon the p+-GaAs cap layer 316 of the red laser structure 318 is deposited a n-type $Al_{0.9}Ga_{0.1}As$ etch stop layer 320. The aluminum mole fraction and doping level of the etch stop layer 320 range from 90 percent and 1 to $5 \times 10^{18}$ cm$^{-3}$, respectively. The thickness of the AlGaAs etch stop layer 320 is approximately 20 nanometers.

Upon the etch stop layer 320 is deposited a n-type GaAs layer 322 conductive buffer layer. The thickness of the GaAs layer 322 is approximately one-half micron (0.5 $\mu$m). The doping level of the n-type GaAs conductive buffer layer 322 is approximately $5 \times 10^{18}$ cm$^{-3}$ or higher.

An n-type $Al_{0.8}Ga_{0.2}As$ lower cladding layer 324 is deposited on the GaAs conductive buffer layer 322. The aluminum mole fraction and doping level of the lower cladding layer 324 range from 50 percent and 1 to $5 \times 10^{18}$ cm$^{-3}$ respectively. The thickness of the AlGaAs cladding layer 324 is approximately one micron ($\mu$m).

Above these layers is deposited an undoped $Al_{0.4}Ga_{0.6}As$ lower confinement layer 326, which has an aluminum content of about 40% and a thickness of about 120 nanometers. After this lower confinement layer 326 has been deposited, an GaAs active layer 328 is deposited, which should result in a light emission at 830 nanometers. The active layer 328 may be a single quantum well, a multiple quantum well, or a layer with thickness greater than that of a quantum well. The thickness of a quantum well typically ranges from five to twenty nanometers and in this example is 7 nanometers. Above the active layer 328 is deposited an undoped $Al_{0.4}Ga_{0.6}As$ upper confinement layer 330. The aluminum content of this confinement layer 330 is typically 40% and a thickness of about 120 nanometers. The lower and upper confinement layers, 326 and 330, together with the active layer 328, generally produce a laser structure with a lower threshold current and a smaller optical divergence.

After the upper confinement layer 330 has been formed, a p-type $Al_{0.8}Ga_{0.2}As$ upper cladding layer 332 of about one micron is deposited. Typically, this cladding layer 332 has an aluminum content of 50% and a magnesium doping level of $5 \times 10^{18}$ cm$^{-3}$. Upon the upper p-type $Al_{0.5}In_{0.5}P$ cladding layer 332 is deposited a barrier reduction $Ga_{0.5}In_{0.5}P$ layer 334, which typically has a thickness of 50 nanometers, and a magnesium doping level of approximately $5 \times 10^{18}$ cm$^{-3}$. Upon this barrier reduction GaInP layer 334 is deposited a p+-GaAs cap layer 336, which typically is 100 nanometers thick with a magnesium doping of $1 \times 10^{19}$ cm$^{-3}$.

These semiconductor layers 322 to 336 form the infrared laser structure 338.

As previously explained, silicon masking and wet chemical etching expose the p+-GaAs cap layer 316 of the red laser structure 318.

As previously explained, implanted si-impurities form a n-type ion implantation conductive channel 342 which extends through the bottom red laser structure 318 into the n-type lower cladding layer 304. The n-type GaAs conductive buffer 322 of the top infrared laser structure 338 is connected to the substrate 302 though this n-type conductive channel 342.

As previously explained, masking and etching through the unmasked portions of the cap layer 336 and barrier reduction layer 334 into the AlGaAs upper cladding layer 332 leaving only a mesa 402 of the cap layer and the barrier reduction layer Similarly masking and etching through the unmasked portions of the cap layer 316 and barrier reduction layer 314 into the AlGaAs upper cladding layer 312 leaving only a mesa 404 of the cap layer and the barrier reduction layer.

Wet oxidation will form native oxide layers from the upper AlGaAs cladding layers.

The native oxide layers 406 have been formed from the AlGaAs upper cladding layer 332 not covered by the silicon nitride strip and the native oxide layers 408 have been formed from the AlGaAs upper cladding layer 312 not covered by the silicon nitride strip.

The remaining unoxidized AlGaAs upper cladding layer 332 under the mesa 402 forms the ridge waveguide 410 for optical confinement of the light emitted from the active region of the infrared laser structure 338. The ridge waveguide 410 is confined by the native oxide layers 406.

The remaining unoxidized AlGaAs upper cladding layer 312 under the mesa 404 forms the ridge waveguide 312 for optical confinement of the light emitted from the active region of the red laser structure 318. The ridge waveguide 412 is confined by the native oxide layers 408.

After the oxidation process and the removal of the silicon nitride stripes, a Ti—Au p-contact 414 can be deposited on the upper surface of the cap layer 336 for the infrared laser structure 338. A Ti—Au p-contact 416 can be deposited on the upper surface of the cap layer 316 for the red laser structure 318. An Au:Ge n-contact 418 can be deposited on the bottom surface of the substrate 302, common to both the infrared laser structure 338 and the red laser structure 318.

An isolation groove 420 is etched between the red laser structure 318 and the infrared laser structure 338 down to the substrate 302 to provide electrical and thermal isolation between the two laser structures in order to reduce crosstalk between the two laser structures.

Although the laser structure consists of AlInP/AlGaAs alloys, the ridge waveguide semiconductor laser with native oxide layers of the present invention would work with other semiconductor materials such as $In_{0.5}(AlGa)_{0.5}P/AlGaAs$ to cover lasing wavelength from 0.65 to 1 μm.

The n-type ion implantation conductive channel can alternately be an impurity induced layer disordered region.

The composition, dopants, doping levels, and dimensions given above are exemplary only, and variations in these parameters are permissible. Additionally, other layers in addition to the ones shown in the figures may also be included. Variations in experimental conditions such as temperature and time are also permitted.

While the invention has been described in conjunction with specific embodiments, it is evident to those skilled in the art that many alternatives, modifications, and variations will be apparent in light of the foregoing description. Accordingly, the invention is intended to embrace all such alternatives, modifications, and variations that fall within the spirit and scope of the appended claims.

What is claimed is:

1. A monolithic edge-emitting semiconductor laser structure comprising:
    a first laser structure having
        an n-type first substrate;
        an n-type first cladding layer formed on said substrate;
        a first confinement layer, a first active layer for emitting light of a first wavelength, and a second confinement layer forming a first active region on said first cladding layer;
        a p-type second cladding layer formed on said second confinement layer above said first active region,
        a p-type first contact layer formed on said second cladding layer,
    a second laser structure having
        an n-type second substrate formed on said first contact layer or on a semiconductor layer on said first contact layer,
        an n-type third cladding layer formed on said second substrate;
        a third confinement layer, a second active layer for emitting light of a second wavelength, and a fourth confinement layer forming a second active region on said third cladding layer;
        a p-type fourth cladding layer formed on said fourth confinement layer above said second active region,
        a p-type second contact layer formed on said fourth cladding layer,
    a n-type ion implanted conductive channel formed between said second substrate of said second laser structure and said first cladding layer of said first laser structure,
    a first electrode and a second electrode which enable biasing of said first active region for emission of light of said first wavelength, and
    a third electrode and said second electrode which enable biasing of said second active region through said conductive channel for emission of light of said second wavelength.

2. The monolithic edge-emitting semiconductor laser structure of claim 1 wherein said first wavelength is in the red range and said second wavelength is in the infrared range.

3. The monolithic edge-emitting semiconductor laser structure of claim 2 wherein said ion implanted in said conductive channel is silicon.

4. The monolithic edge-emitting semiconductor laser structure of claim 2 wherein said first substrate of said first laser structure is GaAs, said first and second cladding layers of said first laser structure are $Al_{0.5}In_{0.5}P$, said first and second confinement layers of said first laser structure are $In_{0.5}(Al_{0.6}Ga_{0.4})_{0.5}P$, said first active layer of said first laser structure is $Ga_{0.4}In_{0.6}P$, said first contact layer of said first laser structure is GaAs, said second substrate of said second laser structure is GaAs, said first and second cladding layers of said second laser structure are $Al_{0.5}In_{0.5}P$, said first and second confinement layers of said second laser structure are $Al_{0.4}Ga_{0.6}As$, said second active layer of said second laser structure is GaAs, and said second contact layer of said second laser structure is GaAs.

5. The monolithic edge-emitting semiconductor laser structure of claim 2 wherein said first substrate of said first laser structure is GaAs, said first cladding layers of said first laser structure is $Al_{0.5}In_{0.5}P$, said first and second confinement layers of said first laser structure are $In_{0.5}(Al_{0.6}Ga_{0.4})_{0.5}P$, said first active layer of said first laser structure is $Ga_{0.4}In_{0.6}P$, said second cladding layer is $Al_{0.5}In_{0.5}P$ and $Al_{0.8}Ga_{0.2}As$, said first contact layer of said first laser structure is GaAs, said second substrate of said second laser structure is GaAs, said first and second cladding layers of said second laser structure are $Al_{0.8}Ga_{0.2}As$, said first and second confinement layers of said second laser structure are $Al_{0.4}Ga_{0.6}As$, said second active layer of said second laser structure is GaAs, and said second contact layer of said second laser structure is GaAs.

6. The monolithic edge-emitting semiconductor laser structure of claim 2 wherein an etch stop layer is formed between said first cap layer of said first laser structure and said second substrate of said second laser structure.

7. The monolithic edge-emitting semiconductor laser structure of claim 2 wherein said first electrode is on said first cap layer of said first laser structure, said second electrode is on said first substrate of said first laser structure and said third electrode is on said second cap layer of said second laser structure.

8. A monolithic edge-emitting semiconductor laser structure comprising:
   a first laser structure having
      an n-type first substrate;
      an n-type first cladding layer formed on said substrate;
      a first confinement layer, a first active layer for emitting light of a first wavelength, and a second confinement layer forming a first active region on said first cladding layer;
      a p-type second cladding layer formed on said second confinement layer above said first active region,
      a first ridge waveguide formed from said second cladding layer, said first ridge waveguide providing optical confinement for light emission from said first active region, said first ridge waveguide being defined by native oxide layers being formed from said second cladding layer,
      a p-type first contact layer formed on said second cladding layer,
   a second laser structure having
      an n-type second substrate formed on said first contact layer or on a semiconductor layer on said first contact layer,
      an n-type third cladding layer formed on said second substrate;
      a third confinement layer, a second active layer for emitting light of a second wavelength, and a fourth confinement layer forming a second active region on said third cladding layer;
      a p-type fourth cladding layer formed on said fourth confinement layer above said second active region,
      a second ridge waveguide formed from said fourth cladding layer, said second ridge waveguide providing optical confinement for light emission from said second active region, said second ridge waveguide being defined by native oxide layers being formed from said fourth cladding layer,
      a p-type second contact layer formed on said fourth cladding layer,
   a n-type ion implanted conductive channel formed between said second substrate of said second laser structure and said first cladding layer of said first laser structure,
   a first electrode and a second electrode which enable biasing of said first active region for emission of light of said first wavelength, and
   a third electrode and said second electrode which enable biasing of said second active region through said conductive channel for emission of light of said second wavelength.

9. The monolithic edge-emitting semiconductor laser structure of claim 8 wherein said first wavelength is in the red range and said second wavelength is in the infrared range.

10. The monolithic edge-emitting semiconductor laser structure of claim 9 wherein said ion implanted in said conductive channel is silicon.

11. The monolithic edge-emitting semiconductor laser structure of claim 9 wherein said first substrate of said first laser structure is GaAs, said first and second cladding layers of said first laser structure are $Al_{0.5}In_{0.5}P$, said first and second confinement layers of said first laser structure are $In_{0.5}(Al_{0.6}Ga_{0.4})_{0.5}P$, said first active layer of said first laser structure is $Ga_{0.4}In_{0.6}P$, said first contact layer of said first laser structure is GaAs, said second substrate of said second laser structure is GaAs, said first and second cladding layers of said second laser structure are $Al_{0.5}In_{0.5}P$, said first and second confinement layers of said second laser structure are $Al_{0.4}Ga_{0.6}As$, said second active layer of said second laser structure is GaAs, and said second contact layer of said second laser structure is GaAs.

12. The monolithic edge-emitting semiconductor laser structure of claim 9 wherein said first substrate of said first laser structure is GaAs, said first cladding layers of said first laser structure is $Al_{0.5}In_{0.5}P$, said first and second confinement layers of said first laser structure are $In_{0.5}(Al_{0.6}Ga_{0.4})_{0.5}P$, said first active layer of said first laser structure is $Ga_{0.4}In_{0.6}P$, said second cladding layer is $Al_{0.5}In_{0.5}P$ and $Al_{0.8}Ga_{0.2}As$, said first contact layer of said first laser structure is GaAs, said second substrate of said second laser structure is GaAs, said first and second cladding layers of said second laser structure are $Al_{0.8}Ga_{0.2}As$, said first and second confinement layers of said second laser structure are $Al_{0.4}Ga_{0.6}As$, said second active layer of said second laser structure is GaAs, and said second contact layer of said second laser structure is GaAs.

13. The monolithic edge-emitting semiconductor laser structure of claim 9 wherein an etch stop layer is formed between said first cap layer of said first laser structure and said second substrate of said second laser structure.

14. The monolithic edge-emitting semiconductor laser structure of claim 9 wherein said first electrode is on said first cap layer of said first laser structure, said second electrode is on said first substrate of said first laser structure and said third electrode is on said second cap layer of said second laser structure.

15. The monolithic edge-emitting semiconductor laser structure of claim 9 wherein said native oxide layers comprise a native oxide of an aluminum-containing semiconductor material.

16. The monolithic edge-emitting semiconductor laser structure of claim 9 wherein an isolation groove extends between said first laser structure and said second laser structure.

* * * * *

UNITED STATES PATENT AND TRADEMARK OFFICE
CERTIFICATE OF CORRECTION

PATENT NO. : 5,999,553
DATED : December 7, 1999
INVENTOR(S) : Decai Sun

Page 1 of 1

It is certified that error appears in the above-identified patent and that said Letters Patent is hereby corrected as shown below:

Column 1,
Line 5, insert as a new paragraph:
-- This invention was made with Government support under Agreement No. 70NANB2H1241 awarded by the Department of Commerce. The Government has certain rights in this invention. --.

Signed and Sealed this

Thirtieth Day of May, 2006

JON W. DUDAS
*Director of the United States Patent and Trademark Office*